(12) United States Patent
Chen et al.

(10) Patent No.: US 6,373,301 B1
(45) Date of Patent: Apr. 16, 2002

(54) FAST-LOCKING DUAL RAIL DIGITAL DELAYED LOCKED LOOP

(75) Inventors: Han-Ning Chen; Ming-Shien Lee; Jew-Yong Kuo; Tsan-Hui Chen, all of Hsinchu (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 09/836,244

(22) Filed: Apr. 18, 2001

(51) Int. Cl.[7] .................................................. H03L 7/00
(52) U.S. Cl. ........................ 327/141; 327/149; 327/150; 327/393; 327/403
(58) Field of Search ................................ 327/141, 144, 327/145, 146, 147, 149, 150, 156, 158, 159, 77, 78, 392, 393, 398, 403

(56) References Cited

U.S. PATENT DOCUMENTS

| | | | |
|---|---|---|---|
| 5,909,130 A | * 6/1999 | Martin et al. | 327/12 |
| 5,990,719 A | * 11/1999 | Dai et al. | 327/244 |
| 6,060,928 A | 5/2000 | Jun et al. | |
| 6,087,857 A | * 7/2000 | Wang | 327/5 |
| 6,125,157 A | 9/2000 | Donnelly et al. | |
| 6,144,713 A | 11/2000 | Eto | |
| 6,166,572 A | 12/2000 | Yamaoka | |

* cited by examiner

Primary Examiner—Timothy P. Callahan
Assistant Examiner—An T. Luu
(74) Attorney, Agent, or Firm—Nixon Peabody LLP; Donald R. Studebaker

(57) ABSTRACT

This present invention discloses a circuit for generating a delay signal, which includes a first delay line for generating a first delay signal, a second delay line for generating a second delay signal, a delay unit for generating an internal delay signal, a first phase detector for generating a first control signal, a second phase detector for generating a second control signal. There's a delay line monitor for generating the first delay control signal and the second delay control signal, and a DTC delay unit for generating the delay signal.

20 Claims, 6 Drawing Sheets

FAST-LOCKING DUAL RAIL DIGITAL DELAYED LOCKED LOOP

FIELD OF INVENTION

This invention is related to digital circuit designs, and more particularly, to digital circuit designs having phase alignment circuit.

BACKGROUND OF INVENTION

Delayed locked loops are frequently employed in high-speed phase alignment circuits such as Double Date Rate Synchronous DRAM (DDR SDRAM). In a system using DDR SDRAM as a memory storage device, data strobe phase control is needed in order to latch the read data returned from the DDR SDRAM (hereinafter, DDR). The data strobe and the data is "edge aligned" when the DDR is returning the read data, while the data strobe and the data is "center-aligned" when DDR is performing write cycles. The different methodologies respectively for read and write cycles are for purpose of simpler design and better yield in DDR manufacturing. Hence, a precise quarter-period delay is used to center-align the strobe and the data when the DDR is performing the write cycle.

FIG. 1 shows a typical DLL circuit. The phase detector 130 compares the ext_clk signal with the delay_clk signal generated by the T/4 delay line 115. The delay line monitor 140, responsive to the increment_or_decrement signal from the phase detector 130, adjusts the amount of delay by outputting the delay_control_number signal to the delay line 115 and 116. Consequently, the system converges and the T/4 delayed clock 150 is obtained. However, the result from the phase detector 130 may shift due to variation of the temperature, causing the delay line monitor 140 to provide inappropriate information to the T/4 delay line 115 and 116. Moreover, process variation may also affect the result from the phase detector 130. Therefore, the present invention proposes a digital delayed locked loop circuit with double lock mechanism and dynamic delay control to solve the problems mentioned above. It should be noted that the present invention can generate any desired delay signal. So it is applicable in any circuit using DLL mechasim.

SUMMARY OF INVENTION

This invention presents a precise time delay generator using a dual-rail digital delay-locked loop (DLL). The dual-rail digital DLL includes a first delay line, a second delay line, a delay unit, a first phase detector, a second phase detector, a delay line monitor, a digital-to-time converter (DTC) delay unit.

The first delay line receives an external clock signal and a first delay control signal to generate a first delay signal. And the second delay line receives a second delay control signal and the external clock signal to generate a second delay signal. The delay unit generates an internal delay signal using the external clock signal, the first delay signal and the second delay signal. The first phase detector receives the internal delay signal and the first delay signal to generate a first control signal, and the second phase detector uses the internal delay signal and the second delay signal to generate a second control signal. The delay line monitor generates the first delay control signal and the second delay control signal, in response to the first and the second control signal. The delay signal is generated by the DTC delay unit, which inputs the external clock signal and the first delay control signal.

This present invention provides a dual rail delayed locked loop in order to generate desired delay signal. The dual-rail DLL design introduced herein dynamically changes the delay of the DTC delay unit due to variation of the voltage and temperature. This circuit provided can be employed in any high-speed phase alignment system, and the amount of delay can be easily extended to 1/N period time by introducing N DTC delay units to the delay lines.

DETAILED DESCRIPTION OF INVENTION

Figure 1:
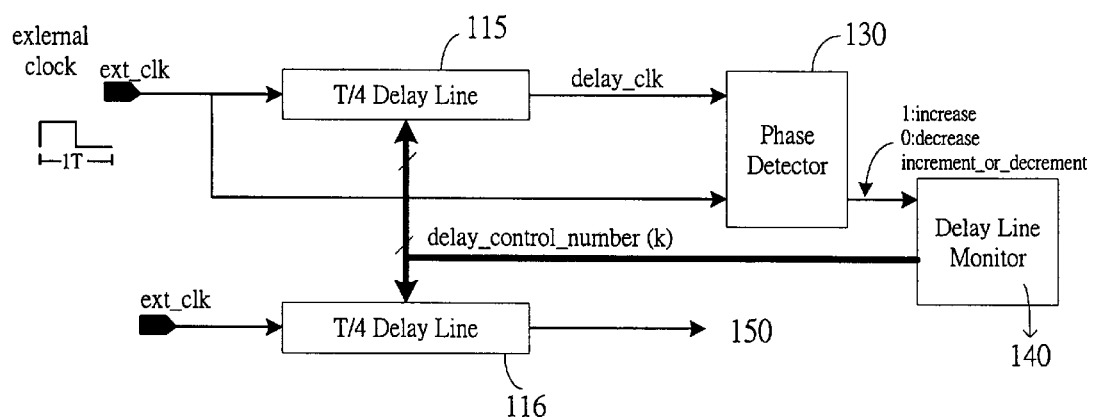
FIG. 1 schematically illustrates a conventional DLL circuit capable of generating a T/4 delayed clock.
Figure 2:
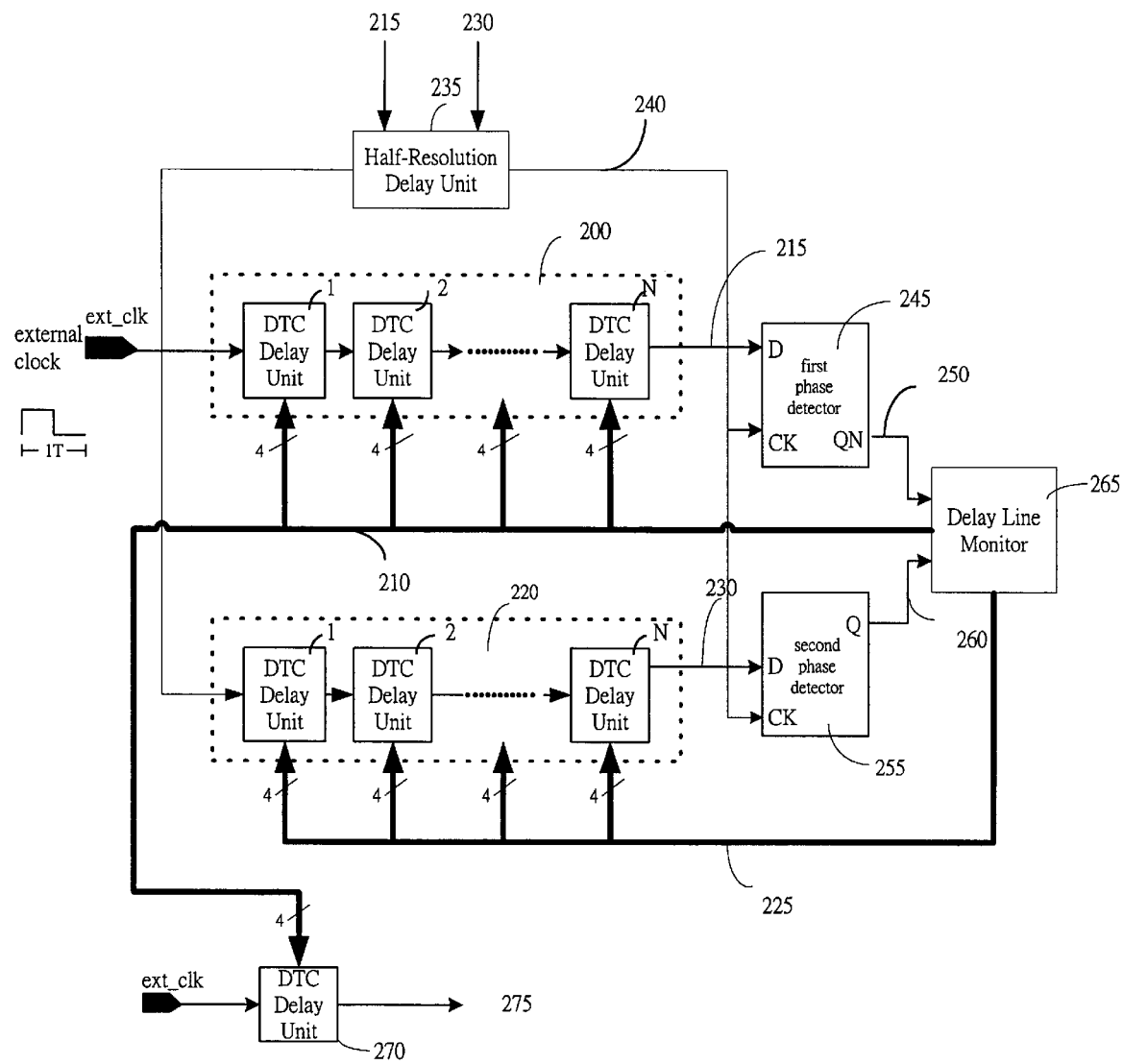
FIG. 2 schematically illustrates a dual-rail DLL circuit capable of generating a T/N delayed clock according to the instant invention.

Please refer to FIG. 2, which schematically illustrates a dual-rail DLL circuit capable of generating a T/N delayed clock according to the instant invention, where T is a clock cycle time and N is a predetermined number. The dual-rail DLL circuit of present invention includes a first delay line 200, a second delay line 220, a delay unit, preferably a half-resolution delay unit 235, a first phase detector 245, a second phase detector 255, a delay line monitor 265, and a DTC delay unit 270.

The first delay line 200, responsive to an external clock signal, ext_clk, and a first delay control signal 210, generates a first delay signal 215. The second delay line 220 generates a second delay signal 230, in response to a second delay control signal 225 and ext_clk. Preferably, the first delay line 200 and the second delay line 220 respectively have N DTC delay units, N is a predetermined number. The half-resolution delay unit 235, responsive to ext_clk, generates an internal delay signal 240. Preferably, the half-resolution delay unit is further responsive to the first delay signal 215 and the second delay signal 230. The first phase detector 245 compares the internal delay signal 240 with the first delay signal 215 to generate a first control signal 250.

The second phase detector 255 compares the internal delay signal 240 with the second delay signal 230 to generate a second control signal 260. The delay line monitor 265 generates the first delay control signal 210 and the second delay control signal 225, in response to the first and the second control signal (250 & 260). For further functional description of the delay line monitor 265, please refer to the associated recitation regarding FIG. 4. The DTC delay unit 270, responsive to ext_clk and the first delay control signal 210, generates the delay signal 275.

Figure 3:
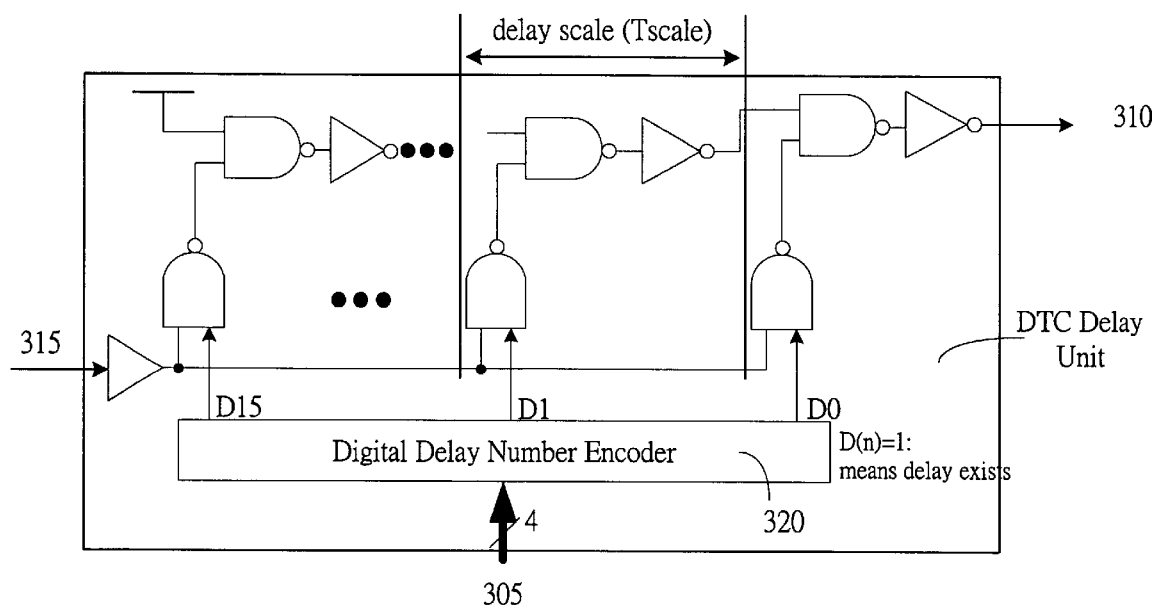
FIG. 3 schematically illustrates an implementation of a DTC delay unit shown in FIG. 2.

FIG. 3 shows how the DTC delay unit translates the 4-bit delay control digital input 305 into the delay signal output 310. The DTC delay unit includes a digital delay number encoder 320. The digital delay number encoder 320 receives the 4-bit delay control digital input 305 and generates D0, D1, . . . to D15 signal. As D(n)=1, it means a corresponding delay exists. Thus there are totally 16 delay-scales (Tscale) in the DTC delay unit. Therefore, the DTC delay unit receives an input signal 315 and outputs the delay signal output 310 based on the 4-bit delay control digital input 305.

Figure 4:
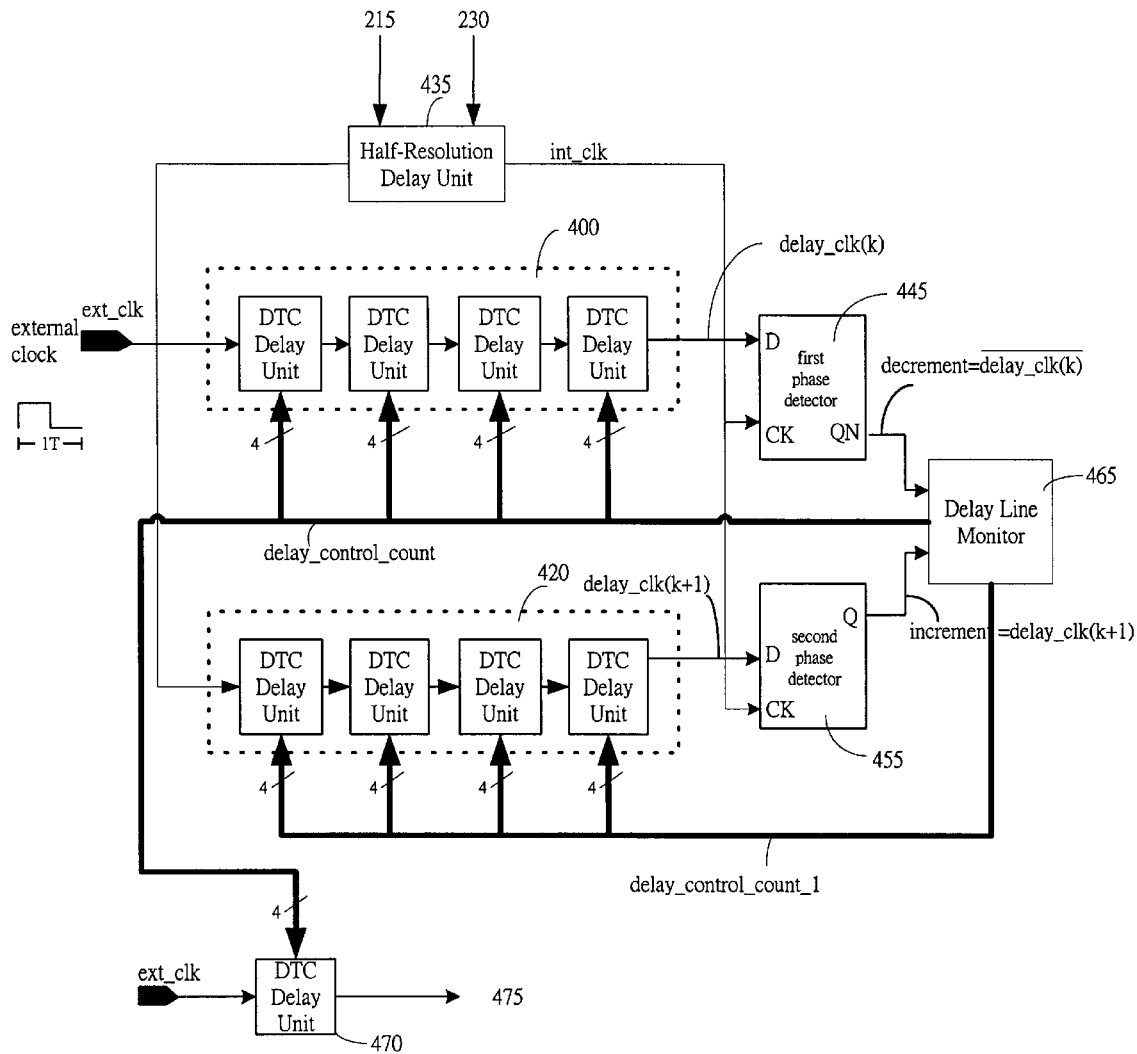
FIG. 4 schematically illustrates a dual-rail DLL circuit capable of generating a T/4 delayed clock according to the instant invention.

Please refer to FIG. 4. In one preferred embodiment of the present invention, the number of DTC delay unit in the first delay line 400 and the second delay line 420 respectively equal to 4. That is, N=4. The first delay line 400 responsive to the first delay control signal, delay_control_count, having value of k, and the ext_clk signal, generates the first delay signal delay_clk(k), which is at least a function of k. The second delay line 420, responsive to the second delay control signal, delay_control_count_1, having value of k+1, and the ext_clk signal, generates the second delay signal, delay_clk(k+1), which is at least a function of (k+1). A minimum resolution Tres is defined as a difference of timings of delay_clk(k) and delay_clk(k+1), which is also the minimum resolution of the first delay line 400 and the second delay line 420. So delay_clk(k) is one Tres ahead of delay_clk(k+1).

Furthermore, the internal delay signal, int_clk, generated by the half-resolution delay unit 435 has a delay of ½ Tres to ext_clk. The first phase detector 445 compares int_clk with delay_clk(k) and outputs the first control signal ("decrement"), the second phase detector 455 compares int_clk with delay_clk(k+1) and outputs the second control signal ("increment"). Preferably, the first phase detector 445 and the second phase detector 455 are D-flip-flop respectively.

For the first phase detector 445 and the second phase detector 455 to latch delay_clk(k) and delay_clk(k+1) correctly, int_clk should fall between delay_clk(k) and delay_clk(k+1). It is necessary to provide enough setup time, Tsetup, to the first phase detector 445 and enough hold time, Thold, for the second phase detector 455. Therefore, Tres should be larger than the sum of Tsetup and Thold. That is, Tres≧(Tsetup+Thold). However, it is known, in most cases, Tsetup is larger than Thold. So, in a preferred embodiment, we make $$Tres \geq 2*Tsetup, \qquad \text{Equation (1).}$$

In one preferred embodiment of the present invention, all DTC delay units in the first delay line 400 and the second delay line 420 are the same. The minimum resolution Tres of the DTC delay unit is determined by twice Tsetup of D flip-flop as mentioned above. If Tsetup of D flip-flop is 0.2 ns, we may select Tres to be 0.5 ns, which is greater than 2*Tsetup and the delay generated by the half-resolution delay unit is 0.25 ns.

Figure 5:
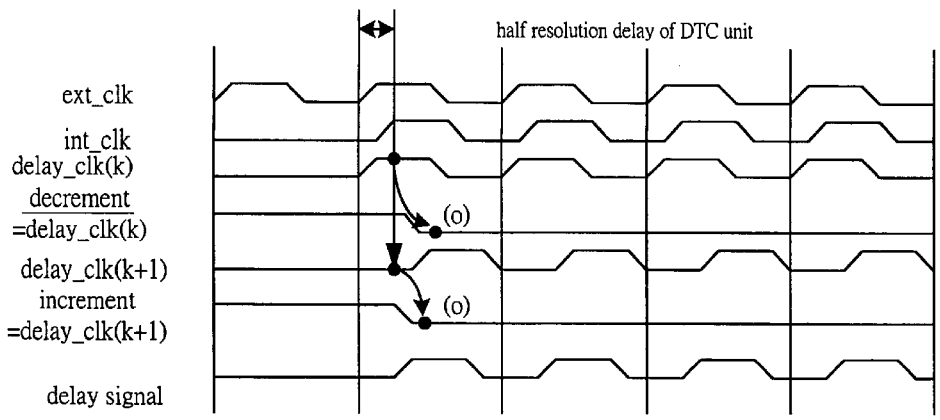
FIG. 5 illustrates the locked case of the dual-rail DLL circuit.

Please refer to FIG. 5. When delay_clk(k) is aligned with ext_clk, the locked condition is met. Delay_clk(k) is just one clock period later than ext_clk and delay_clk(k+1) is later than ext_clk by an amount of one clock period plus Tres. Under the locked condition, the first phase detector 445 sets the decrement signal to 0, and the second phase detector 455 sets the increment signal to 0. Then the delay line monitor 465 does not change the values of delay_control_count and delay_control_count_1.

The DTC delay unit 470, responsive to ext_clk and delay_control_count, generates the delay signal 475. Thus, in this example of N=4, a quarter-period delayed clock signal 475 is obtained from the DTC delay unit 470.

Figure 6:
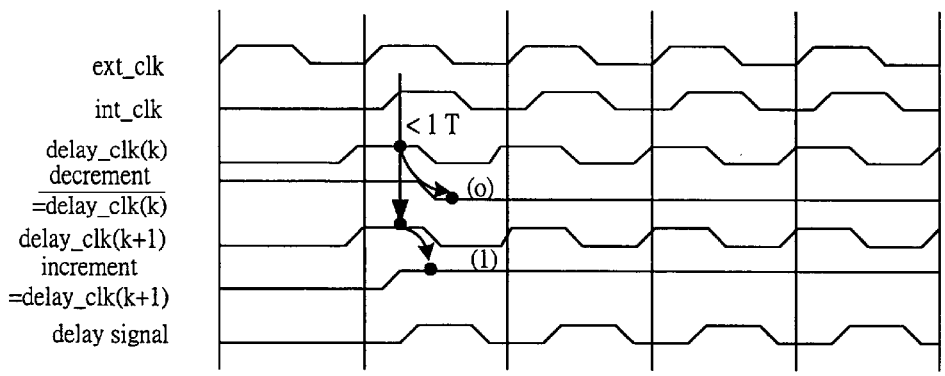
FIG. 6 illustrates the lead case of the dual-rail DLL circuit.

For the lead case shown in FIG. 6, delay_clk(k) is earlier than ext_clk by an amount of less than one clock cycle. Under the lead case, The first phase detector 445 sets the decrement signal to 0, and the second phase detector 455 sets the increment signal to 1. Then the delay line monitor 465 increases the values of delay_control_count and delay_control_count_1 by 1 respectively. In response to ext_clk and delay_control count, the first delay line 400 generates delay_clk(k). The second delay line 420 generates delay_clk(k+1), in responsive to ext_clk and delay_control_count_1. Thus the delay of the first delay line 400 and the second delay line 420 increases. If delay_clk(k) is still earlier than ext_clk by an amount of less than one clock cycle, the dual-rail DLL circuit follows the steps mentioned above, until locked case shown in FIG. 5 is achieved.

Figure 7:
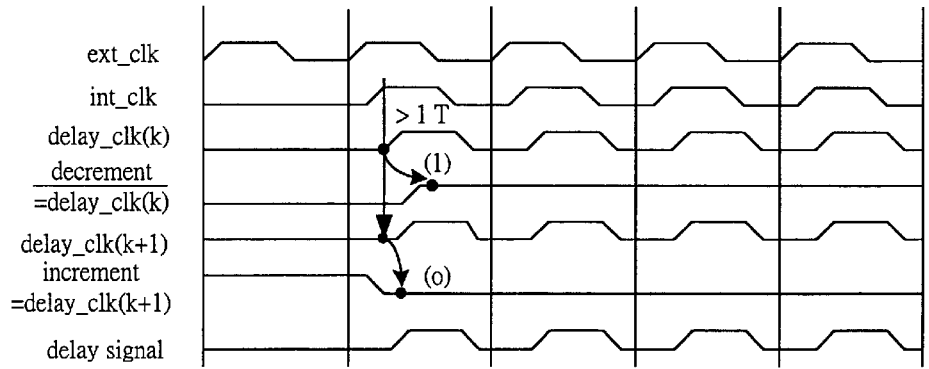
FIG. 7 illustrates the lag case of the dual-rail DLL circuit.

For the lag case shown in FIG. 7, delay_clk(k) is later than ext_clk by an amount less than one clock cycle. Under the lag case, the first phase detector 445 sets the decrement signal to 1, and the second phase detector 455 sets the increment signal to 0. Then the delay line monitor 465 decreases the values of delay_control_count and delay_control_count_1 by 1 respectively. In response to ext_clk and delay_control_count, the first delay line 400 generates delay_clk(k). The second delay line 420 generates delay_clk(k+1), in responsive to ext_clk and delay_control_count_1. Thus the delay of the first delay line 400 and the second delay line 420 decreases. If delay_clk(k) is still later than ext_clk by an amount of less than one clock cycle, the dual-rail DLL circuit follows the steps mentioned above, until locked case shown in FIG. 5 is achieved.

Figure 8:
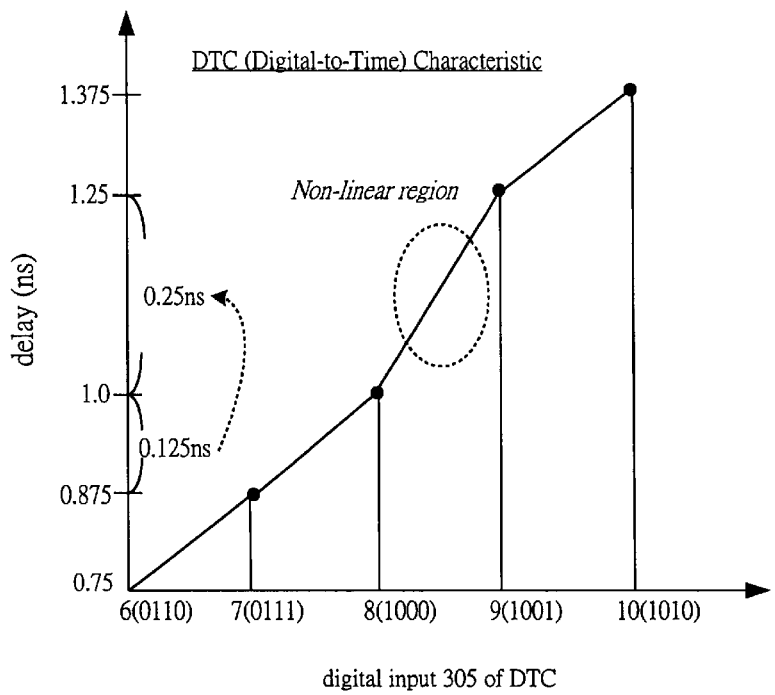
FIG. 8 illustrates the non-linear characteristics of a DTC delay unit caused by process variation.
Figure 9:
FIG. 9 illustrates the non-linear characteristics of a Delay Line with 4 DTC delay units caused by process variation.
Figure 9:
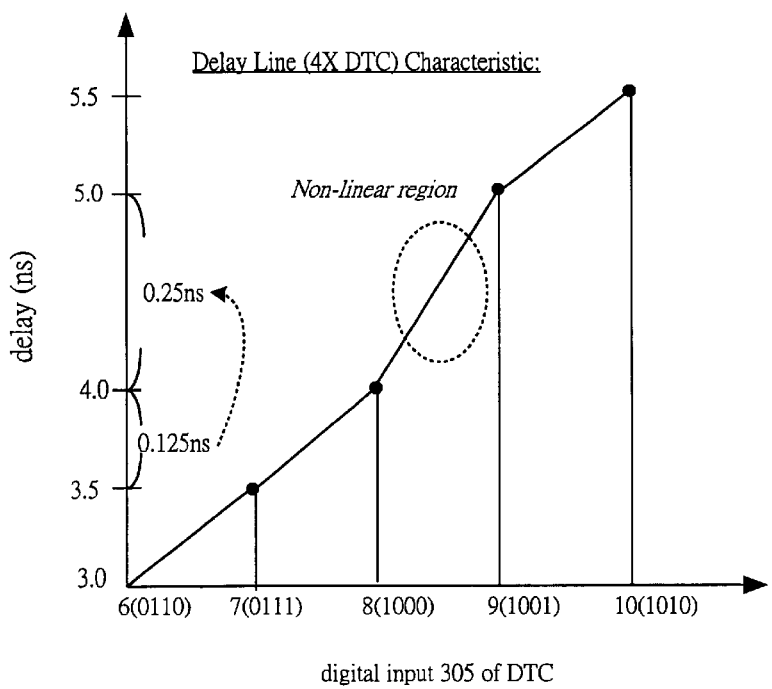

Besides, if there is non-linearity characteristic in the segment of DTC delay units, it does not affect the convergence of the system. Since the two delay lines 400 and 420 are symmetrical circuit structures, they vary at the same tendency and percentage due to process, temperature and supply voltage variation. FIG. 8 shows a non-linear characteristic of delay scale (Tscale) of a single DTC unit occurs in the range of 8 (i.e. 1000) to 9 (i.e. 1001) of delay control digital input 305. The value of Tscale is changed from 0.125 ns to 0.25 ns, causing a nonlinear condition. Accordingly, the minimum resolution, i.e. Tres, of the first delay line 400 and the second delay line 420 changes from 0.5 ns to 1 ns shown in FIG. 9. Int_clk has a 0.25 ns shift compared to ext_clk. Therefore, int_clk still falls between delay_clk(k) and delay_clk(k+1), and the dual rail DLL circuit can tolerate the PVT (process, voltage, temperature) variation.

Furthermore, it can be easily derived that the dual-rail digital DLL design can generate T/N time delay, where N is the number of DTC delay units in first delay line 400 and the second delay line 420 respectively, and T is the clock cycle time. Instead of 16 delay scales in FIG. 3, supposed there are L Tscales in a single DTC delay unit for this invention. Then the resulted following equations as the locked condition is met, shown as equation (2).

$$T=Tscale*L*N, \qquad \text{Equation (2).}$$

Then, $$Tres=delay\_clk(K+1)-delay\_clk(K)=Tscale*(K+1)*N-Tscale*L*N=Tscale*N, \qquad \text{Equation (3).}$$

From the equations (1), (2) and (3) given above, $$T=L*Tres \geq 2L*Tsetup, \text{ when locked case occurs} \qquad \text{Equation (4).}$$

From equation (2), $$Tscale \geq (2/N)*Tsetup, \qquad \text{Equation (5).}$$

In one preferred embodiment, assume Tsetup=0.2 ns, then we can choose Tres as 0.5 ns from equation (1), if the target cycle time (T) is 7.5 ns (133 MHz), from equation (4), we can choose L=15.

In another preferred embodiment, assuming N=4 in equation (5), if we choose Tsetup to be 0.2 ns, then Tscale$\geq$0.5*Tsetup=0.1 ns. Therefore Tscale should be larger than 0.1 ns to tolerate the PVT variation.

In the foregoing specification the invention has been described with reference to specific exemplar aspects thereof. It will, however, be evident that various modification and changes may be made thereto without departing from the broader spirit and scope of the invention. The specification and drawings are, accordingly, to be regarded in an illustrative rather than restrictive sense.

What is claimed is:

1. A circuit for generating a delay signal, comprising:
   a first delay line, in response to an external clock signal and a first delay control signal, for generating a first delay signal;
   a second delay line, in response to a second delay control signal and the external clock signal, for generating a second delay signal;
   a delay unit, responsive to the external clock signal, for generating an internal delay signal;
   a first phase detector, responsive to the internal delay signal and the first delay signal, for generating a first control signal;
   a second phase detector, responsive to the internal delay signal and the second delay signal, for generating a second control signal;
   a delay line monitor, responsive to the first and the second control signal, for generating the first delay control signal and the second delay control signal; and
   a digital-to-time converter (DTC) delay unit, responsive to the external clock signal and the first delay control signal, for generating the delay signal.

2. The circuit of claim 1, wherein the first delay line and the second delay line have N DTC delay units respectively, N is a predetermined number.

3. The circuit of claim 2, wherein N equals to 4.

4. The circuit of claim 1, wherein the internal delay signal generated by the delay unit has a delay of ½ Tres to the external clock signal, wherein Tres is a difference of timings of the first delay signal and the second delay signal.

5. The circuit of claim 1, wherein the delay unit is further responsive to the first delay signal and the second delay signal.

6. The circuit of claim 1, wherein the first delay control signal and the second delay control signal having initial values of k and k+1 respectively, k is a number, the delay line monitor generates the first and the second delay control signals by the steps of:
   if the first control signal is 1 and the second control signal is 0, decreasing the values of the first delay control signal (k) and the second delay control signal (k+1) by 1; and
   if the first control signal is 0 and the second control signal is 1, increasing the values of the first delay control signal (k) and the second delay control signal (k+1) by 1.

7. The circuit of claim 2, wherein the delay signal generated by the DTC delay unit has a delay of T/N to the external clock signal, T is a cycle time of the external clock signal.

8. The circuit of claim 3, the delay signal generated by the DTC delay unit has a delay of T/4 to the external clock signal.

9. The circuit of claim 1, wherein the first phased detector is a D flip-flop.

10. The circuit of claim 1, wherein the second phase detector is a D flip-flop.

11. A method for generating a delay signal, comprising the following steps:
   (11.1) providing a first delay line, in response to an external clock signal and the first delay control signal, for generating a first delay signal;
   (11.2) providing a second delay line, in response to a second delay control signal, for generating a second delay signal;
   (11.3) providing a delay unit, responsive to the external clock signal, for generating an internal delay signal;
   (11.4) providing a first phase detector, responsive to internal delay signal and the first delay signal, for generating a first control signal;
   (11.5) providing a second phase detector, responsive to the internal delay signal and the second delay signal, for generating a second control signal;
   (11.6) providing a delay line monitor, responsive to the first and the second control signal, for generating the first delay control signal and the second delay control signal; and
   (11.7) providing a digital-to-time converter (DTC) delay unit, responsive to the external clock signal and the first delay control signal, for generating the delay signal.

12. The method of claim 11, wherein the first delay line and the second delay line have N DTC delay units respectively, N is a predetermined number.

13. The method of claim 12, wherein N equals to 4.

14. The method of claim 11, wherein the internal delay signal generated by the delay unit has a delay of ½ Tres to the external clock signal, wherein Tres is a difference of timings of the first delay signal and the second delay signal.

15. The circuit of claim 11, wherein the delay unit is further responsive to the first delay signal and the second delay signal.

16. The method of claim 11, wherein the first delay control signal and the second delay control signal having initial values of k and k+1 respectively, k is a number, the delay line monitor generates the first and the second delay control signals by the steps of:
   if the first control signal is 1 and the second control signal is 0, decreasing the values of the first delay control signal (k) and the second delay control signal (k+1) by 1; and
   if the first control signal is 0 and the second control signal is 1, increasing the values of the first delay control signal (k) and the second delay control signal (k+1) by 1.

17. The method of claim 11, wherein the delay signal generated by the DTC delay unit has a delay of T/N to the external clock signal, T is a cycle time of the external clock signal, N is a predetermined number.

18. The method of claim 11, the delay signal generated by the DTC delay unit has a delay of T/4 to the external clock signal.

19. The method of claim 11, wherein the first phased detector is a D flip-flop.

20. The method of claim 11, wherein the second phased detector is a D flip-flop.

* * * * *